United States Patent
Cattani et al.

(10) Patent No.: US 11,094,807 B2
(45) Date of Patent: Aug. 17, 2021

(54) ANTI-AGING ARCHITECTURE FOR POWER MOSFET DEVICE

(71) Applicant: STMicroelectronics S.r.l., Agrate Brianza (IT)

(72) Inventors: Alberto Cattani, Cislago (IT); Alessandro Gasparini, Cusano Milanino (IT)

(73) Assignee: STMicroelectronics S.r.l., Agrate Brianza (MB) (IT)

(*) Notice: Subject to any disclaimer, the term of this patent is extended or adjusted under 35 U.S.C. 154(b) by 81 days.

(21) Appl. No.: 16/561,670

(22) Filed: Sep. 5, 2019

(65) Prior Publication Data

US 2021/0074835 A1    Mar. 11, 2021

(51) Int. Cl.
*H01L 29/739* (2006.01)
*H02M 3/158* (2006.01)
*H02M 1/32* (2007.01)
*H02M 1/088* (2006.01)

(52) U.S. Cl.
CPC ........ *H01L 29/7395* (2013.01); *H02M 1/088* (2013.01); *H02M 1/32* (2013.01); *H02M 3/1584* (2013.01)

(58) Field of Classification Search
CPC ............ H01L 27/0248; H01L 29/7395; H02M 1/088; H02M 1/32; H02M 3/1584
See application file for complete search history.

(56) References Cited

U.S. PATENT DOCUMENTS

| | | | |
|---|---|---|---|
| 7,405,495 B2 | 7/2008 | Guillarme et al. | |
| 8,432,139 B2 | 4/2013 | Suzuki | |
| 9,425,612 B2 | 8/2016 | Tsao et al. | |
| 10,075,073 B2 | 9/2018 | Guan et al. | |
| 10,199,878 B2 | 2/2019 | Lee | |
| 2011/0181255 A1* | 7/2011 | Hashimoto | H02M 3/1588 323/272 |
| 2011/0187439 A1* | 8/2011 | Sugie | H03K 17/687 327/424 |
| 2013/0010396 A1* | 1/2013 | Chen | H02H 3/22 361/111 |
| 2013/0039100 A1* | 2/2013 | Kazama | H03K 17/164 363/41 |
| 2014/0241017 A1 | 8/2014 | Kasai | |
| 2015/0263634 A1* | 9/2015 | Fu | H02M 3/33592 363/21.02 |
| 2016/0191021 A1* | 6/2016 | Zhao | H03K 17/127 327/109 |
| 2018/0175735 A1* | 6/2018 | Zhao | H02M 3/3376 |
| 2020/0136521 A1* | 4/2020 | Lin | H02M 3/33592 |

* cited by examiner

*Primary Examiner* — Rafael O De Leon Domenech
(74) *Attorney, Agent, or Firm* — Crowe & Dunlevy

(57) ABSTRACT

A power MOS stage includes a first power MOS device and a second power MOS devices connected in parallel between a first node and a second node, the first power MOS device having a first voltage rating and the second power MOS device having a second voltage rating that is lower than the first voltage rating. A driver circuit is configured to drive control nodes of the first and second power MOS devices in a sequential manner when actuating the power MOS stage by actuating the first power MOS device before actuating the second power MOS device. The control nodes of the first and second power MOS devices are further driven in a sequential manner when deactuating the power MOS stage by deactuating the second power MOS device before deactuating the first power MOS device.

28 Claims, 1 Drawing Sheet

ANTI-AGING ARCHITECTURE FOR POWER MOSFET DEVICE

TECHNICAL FIELD

Embodiments and implementations relate to a power metal oxide semiconductor field effect transistor (MOSFET) device and, in particular, to an architecture for a power MOSFET that protects against aging performance degradation when operating near or above the maximum operating voltage (MOV) of the device.

BACKGROUND

A power metal oxide semiconductor field effect transistor (MOSFET) device is a common transistor switching device used in numerous circuit applications well known to those skilled in the art. In a power integrated circuit, efficiency is mainly related to power management circuits and in particular to the power MOS and its driver. This observation is valid for both a low-power application or operating condition and a high-power application or operating condition. In fact: in a low-power condition, one of the main power losses is related to the switching losses of the power MOS and of its driving stage; and in a high-power condition, the main contribution of power dissipation is related to Joule dissipation on the power MOS stage. So, it is very important in these circuit applications to optimize the dimensioning of the power MOS and, in complete relationship, also of the driver circuit that will control the operation of the power MOS.

The first criteria considered in the selection of a power devices is to evaluate the maximum voltage that will be applied between the conduction terminals of the power MOS and select the correct voltage class of the device itself. As known in the art, two limits for voltage rating or capability of a power MOS device are defined for a given technology platform: the Maximum Operating Voltage (MOV): which identifies the maximum voltage up to which the device will work without any degradation or damage; and the Absolute Maximum Rating (AMR): which identifies the maximum voltage at which the device will be definitely damaged. The AMR voltage is greater than, or at least equal to, the MOV.

When a power device works between the MOV and the AMR voltage, the device will be affected by some degradation but without any damage which would preclude normal operation of the device. In the specific case of a power MOS device, when the device works above the MOV it will be impacted in terms of an increase of leakage currents (when the transistor switch is turned off) and a degradation of resistance value (when the transistor switch is turned on). These impacts happen during the lifetime of the device and it is possible to evaluate the effects by performing an aging simulation (such as where some parameters are changed to evaluate performance degradation during device lifetime, for example, over a time period of 10 years).

In general, it is valid that a lower voltage MOS has better characteristics than a higher voltage MOS in terms of resistivity per area and so it is possible to reach the same Rdson performance with less area and correspondingly less parasitic capacitance for the driving stages. A lower voltage MOS can guarantee a better efficiency in both low-power and high-power conditions for these reasons. In the performance optimization process, the best solution is to use the lowest possible voltage MOS that is suitable for the application under development.

In general, there are two typical and possible scenarios for power stage MOS selection: use a power MOS with an MOV that is higher than a maximum application voltage and an AMR voltage that is higher than the maximum application voltage; or use a power MOS with an AMR voltage that is higher than the maximum application voltage, but having an MOV that is lower than the maximum application voltage.

In consideration of the first scenario, supposing to have the same target specification of Rdson, the goal is achievable by using a larger power MOS. Such a device will occupy more silicon area on the chip and further will necessitate use of a larger driver circuit that could also impact the total occupied area of the device. Another performance loss due to the usage of the larger power MOS is related to an increase in driver power dissipation due to a higher parasitic capacitance. In conclusion, using a power MOS with an MOV voltage and an AMR voltage that are both higher than the maximum application voltage leads to an increase of silicon area and a higher switching power dissipation.

In consideration of the second scenario, a much smaller power MOS can be used due to its better Rdson performance, but because of the risk of working above the MOV voltage, the power MOS will be adversely affected by Rdson degradation and other effects (for example, leakage). In order to compensate for these aging effects, a bigger power MOS has to be designed to ensure operation with at least the desired Rdson value. As a result, however, this will lead to experiencing some of the drawbacks noted above for the first scenario because of the increase in occupied area and increase in power dissipations. Another possible problem with this solution is related to the aging effect that produces some performance drift of the power MOS during its lifetime. In some circuit applications, this performance drift is not acceptable.

For example, suppose that a power MOS is being designed for a circuit application where the device will have to work with a maximum application voltage of 11V, and further supposed that the only power MOS devices which are available in the selected technology platform are: a relatively higher voltage power MOS A: which has an MOV=18V and an AMR=25V; and a relatively lower voltage power MOS B: which has an MOV=8V and an AMR=12V.

The circuit designer could select to use the power MOS A which guarantees to work below both the MOV and the AMR and thus obtain: Stable performance during device lifetime span; Larger area occupation due to higher Rdson/area parameter; Larger driver due to the larger MOS dimensioning; and Higher switching dissipation due to the larger MOS dimensioning. The circuit designer could alternatively select to use the power MOS B which guarantees to work above the MOV but below the AMR and thus obtain: Variable performance during lifetime due to aging effect; Larger area occupation due to aging compensation; Larger driver due to larger MOS dimensioning; Higher switching dissipation due to larger MOS dimensioning. Neither selection is ideal.

There is accordingly a need in the art for a solution that will help to optimize the selection and dimensioning of the power MOS. Preferably, the solution will support use of the power MOS in a variety of circuit applications including: power structures like DC-DC converters (buck, boost, buck-boost and so on) and power drivers (half-bridge, full-bridge and so on).

SUMMARY

In an embodiment, a circuit comprises: a power MOS stage; and a driver circuit configured to drive the power MOS stage. The power MOS stage comprises a first power MOS device and a second power MOS devices connected in parallel between a first node and a second node, the first power MOS device having a first voltage rating and the second power MOS device having a second voltage rating that is lower than the first voltage rating. The driver circuit is configured to drive control nodes of the first and second power MOS devices in a sequential manner when actuating the power MOS stage by actuating the first power MOS device with the first voltage rating before actuating the second power MOS device with the second voltage rating.

In an embodiment, a circuit including a half-bridge driver comprises: a high-side power MOS stage; a low-side power MOS stage coupled in series with the high-side power MOS stage at an intermediate node; and a driver circuit configured to drive the high-side and low-side power MOS stages; wherein at least one of the high-side and low-side power MOS stages comprises: a first power MOS device and a second power MOS devices connected in parallel between a first node and the intermediate node, the first power MOS device having a first voltage rating and the second power MOS device having a second voltage rating that is lower than the first voltage rating; and wherein the driver circuit is configured to drive control nodes of the first and second power MOS devices in a sequential manner when actuating the power MOS stage by actuating the first power MOS device with the first voltage rating before actuating the second power MOS device with the second voltage rating.

In an embodiment, a power MOS stage includes a first power MOS device and a second power MOS devices connected in parallel between a first node and a second node, the first power MOS device having a first voltage rating and the second power MOS device having a second voltage rating that is lower than the first voltage rating. A method for driving the power MOS stage comprises: driving control nodes of the first and second power MOS devices in a sequential manner when actuating the power MOS stage by: actuating the first power MOS device with the first voltage rating; and then actuating the second power MOS device with the second voltage rating.

BRIEF DESCRIPTION OF THE DRAWINGS

Other advantages and features of the invention will become apparent on examining the detailed description of completely non-limiting embodiments and implementations, and the appended drawings, in which.

DETAILED DESCRIPTION

Figure 1:
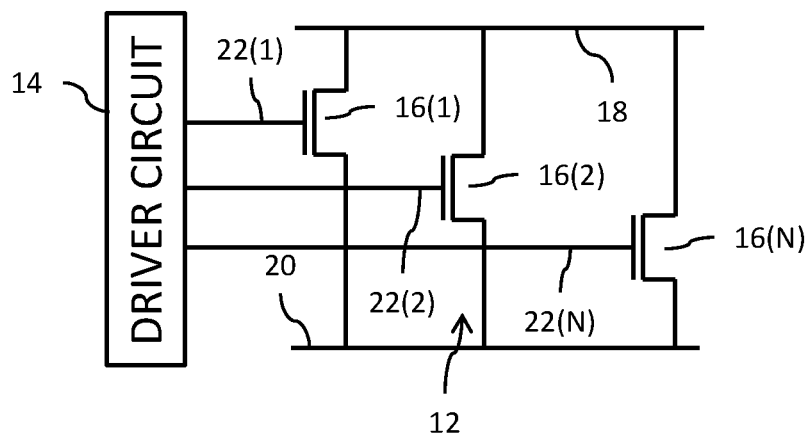
FIG. 1 is a circuit diagram of a power circuit including a power MOS stage and a driver circuit.

Reference is now made to FIG. 1 which shows a circuit diagram of a power circuit 10 including a power MOS stage 12 and a driver circuit 14 configured to drive the power MOS stage 12. The power MOS stage 12 is implemented using a plurality of power MOS devices 16(1)-16(N) that are connected in parallel with each other between a first conduction node 18 and a second conduction node 20. The included power MOS devices 16(1)-16(N) are all of a same conductivity type (i.e., they are all n-type devices or are all p-type devices). A generic MOS circuit schematic symbol is used in FIG. 1, it being understood that the symbol used represents either an n-type device or a p-type device depending on design selection for the given circuit application. Each power MOS device 16 has a control terminal 22, with the control terminals 22(1)-22(N) being driven by signals generated by the driver circuit 14.

The power MOS devices 16(1)-16(N) have different voltage rating characteristics. For example, the power MOS device 16(1) has a voltage rating characteristic V1 (with an MOV=$V_{MOV1}$ and AMR=$V_{AMR1}$), the power MOS device 16(2) has a voltage rating characteristic V2 (with an MOV=$V_{MOV2}$ and AMR=$V_{AMR2}$) and the power MOS device 16(N) has a voltage rating characteristic VN (with an MOV=$V_{MOVN}$ and AMR=$V_{AMRN}$). The relative relationship between the MOV's for the power MOS devices 16(1)-16(N) is: $V_{MOV1}>V_{MOV2}>V_{MON}$. The relative relationship between the AMR's for the power MOS devices 16(1)-16(N) is: $V_{AMR1}>V_{AMR2}>V_{AMRN}$.

When actuating (i.e., turning on) the power MOS stage 12, the driver circuit 14 operates to control a sequential actuation of the power MOS devices 16(1)-16(N) in an order starting with the power MOS device 16 having the highest voltage rating characteristic and ending with the power MOS device 16 having the lowest voltage rating characteristic. In the example of FIG. 1, the sequence of actuation would be actuation of power MOS device 16(1) first, power MOS device 16(2) second, and lastly power MOS device 16(N). Thus, the driver circuit 14 would assert the signal applied to control terminal 22(1) first (turning on MOS device 16(1)), assert the signal applied to control terminal 22(2) second (turning on MOS device 16(2)), and lastly assert the signal applied to control terminal 22(N) (turning on MOS device 16(N)).

When deactuating (i.e., turning off) the power MOS stage 12, the driver circuit 14 operates to control a sequential deactuation of the power MOS devices 16(1)-16(N) in an order starting with the power MOS device 16 having the lowest voltage rating characteristic and ending with the power MOS device 16 having the highest voltage rating characteristic. In the example of FIG. 1, the sequence of deactuation would be deactuation of power MOS device 16(N) first, power MOS device 16(2) second, and lastly power MOS device 16(1). Thus, the driver circuit 14 would deassert the signal applied to control terminal 22(N) first (turning off MOS device 16(n)), deassert the signal applied to control terminal 22(2) second (turning off MOS device 16(2)), and lastly deassert the signal applied to control terminal 22(N) (turning off MOS device 16(1)).

The operational concept here is for the driver circuit 14 to turn on/off power MOS devices 16 having relatively higher voltage rating characteristics during time phases when that particular power MOS device 16 is more likely to be affected by degradation, and furthermore to turn on/off power MOS devices 16 having relatively lower voltage rating characteristics during time phases when the drain to source voltages (Vds) across that particular power MOS device 16 is negligible due to the presence of the parallel connected power MOS devices 16 having relatively higher voltage rating characteristics. This control sequencing will prevent aging degradation on lower voltage power MOS devices while the higher voltage power MOS devices are naturally protected because the higher voltage power MOS devices are working with a Vds voltage below MOV.

This idea for driving the parallel connected MOS devices of different voltage rating characteristic is directly correlated to the mechanism of aging degradation on MOS when the MOS is working above MOV but below AMR. A MOS transistor has aging degradation when it has a large Vds (above MOV) on its terminals and at the same time its gate to source (Vgs) is near the threshold voltage. The duration and number of occurrences of this operating condition directly impacts the performance degradation that the MOS reaches for both Rdson and leakage current. In a power stage, these phases have a very short duration (in the order of some ns) but could have a high occurrence due to the operation frequency (hundreds of kHz or MHz) of the power stage.

Figure 2:
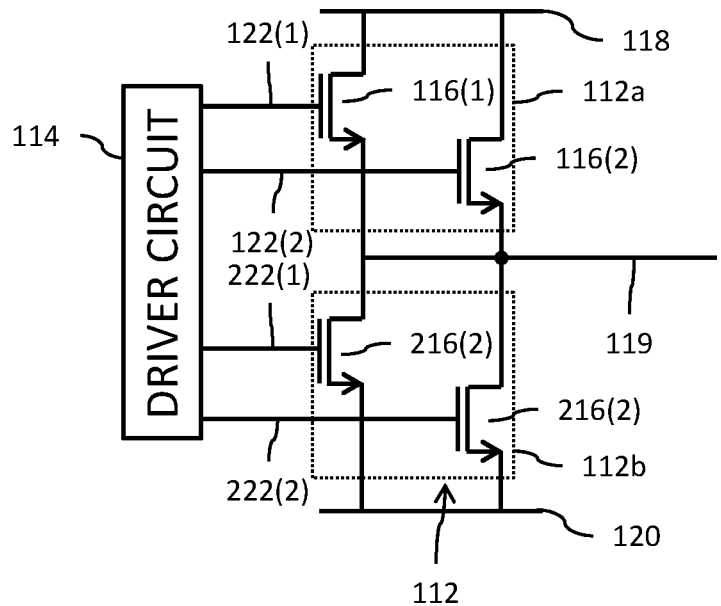
FIG. 2 is a circuit diagram of a power circuit including a half-bridge power MOS stage and a driver circuit.

Reference is now made to FIG. 2 which shows a circuit diagram of a power circuit 110 including a half-bridge power MOS stage 112 and a driver circuit 114 configured to drive the half-bridge power MOS stage 112. The half-bridge power MOS stage 112 includes a high-side power MOS circuit 112a coupled in series with a low-side power MOS circuit 112b between a first node 118 and a second node 120. The series connection between the circuits 112a and 112b is made at an intermediate node 119. The power circuit 110 may be used in connection with a DC-DC converter application where an input voltage is applied to the first node 118, an inductor is coupled to the intermediate node 119, and an output voltage is generated at the second node 120. The power circuit 110 may be further used in connection with a circuit application for driving an inductive load, such as a motor, where an input voltage is applied to first node 118, the inductive load (motor winding) is coupled to the intermediate node 119, and a ground voltage is applied to the second node 120.

The high-side power MOS circuit 112a is implemented using first and second n-channel power MOS devices 116(1)-116(2) that are connected in parallel with each other between the first node 118 and the intermediate node 119. Each power MOS device 116 has a control terminal 122, with the control terminals 122(1)-122(2) being driven by signals generated by the driver circuit 114.

The low-side power MOS circuit 112b is implemented using first and second n-channel power MOS devices 216(1)-216(2) that are connected in parallel with each other between the intermediate node 119 and the second node 120. Each power MOS device 216 has a control terminal 222, with the control terminals 222(1)-222(2) being driven by signals generated by the driver circuit 114.

The exemplary use of two MOS devices in each circuit 112 is by way of example only. It will be understood that each circuit 112 could include three or more MOS devices as shown in FIG. 1.

The power MOS devices 116(1)-116(2) have different voltage rating characteristics. For example, the power MOS device 116(1) has a voltage rating characteristic V1 (with an MOV=$V_{MOV1}$ and AMR=$V_{AMR1}$), and the power MOS device 116(2) has a voltage rating characteristic V2 (with an MOV=$V_{MOV2}$ and AMR=$V_{AMR2}$). The relative relationship between the MOV's for the power MOS devices 116(1)-116(2) is: $V_{MOV1}>V_{MOV2}$. The relative relationship between the AMR's for the power MOS devices 116(1)-116(2) is: $V_{AMR1}>V_{AMR2}$.

The power MOS devices 216(1)-216(2) have different voltage rating characteristics. For example, the power MOS device 216(1) has a voltage rating characteristic V1 (with an MOV=$V_{MOV1}$ and AMR=$V_{AMR1}$), and the power MOS device 216(2) has a voltage rating characteristic V2 (with an MOV=$V_{MOV2}$ and AMR=$V_{AMR2}$). The relative relationship between the MOV's for the power MOS devices 216(1)-216(2) is: $V_{MOV1}>V_{MOV2}$. The relative relationship between the AMR's for the power MOS devices 216(1)-216(2) is: $V_{AMR1}>V_{AMR2}$.

The actuation of the high-side power MOS circuit 112a involves a sequential actuation of the power MOS devices 116(1)-116(2) as follows:

the driver circuit 114 applies a signal to control terminal 122(1) to turn on power MOS device 116(1), there will be a relatively smaller Vds across the device; and after a short delay time (for example, in the range of a few nanoseconds, over which period time the Vds is small), the driver circuit 114 applies a signal to control terminal 122(2) to turn on power MOS device 116(2), the turn on here occurs with the relatively small Vds and thus there is no degradation.

The deactuation of the high-side power MOS circuit 112a involves a sequential deactuation of the power MOS devices 116(1)-116(2) as follows:

the driver circuit 114 applies a signal to control terminal 122(2) to turn off power MOS device 116(2), the turn off here occurs with the relatively small Vds and thus there is no degradation; and after a short delay time (for example, in the range of a few nanoseconds), the driver circuit 114 applies a signal to control terminal 122(1) to turn off power MOS device 116(1), there will be a relatively smaller Vds across the device.

The actuation of the low-side power MOS circuit 112b involves a sequential actuation of the power MOS devices 216(1)-216(2) as follows:

the driver circuit 114 applies a signal to control terminal 222(1) to turn on power MOS device 216(1), there will be a relatively smaller Vds across the device; and after a short delay time (for example, in the range of a few nanoseconds, over which period time the Vds is small), the driver circuit 114 applies a signal to control terminal 222(2) to turn on power MOS device 216(2), the turn on here occurs with the relatively small Vds and thus there is no degradation.

The deactuation of the low-side power MOS circuit 112b involves a sequential deactuation of the power MOS devices 216(1)-216(2) as follows:

the driver circuit 114 applies a signal to control terminal 222(2) to turn off power MOS device 216(2), the turn off here occurs with the relatively small Vds and thus there is no degradation; and after a short delay time (for example, in the range of a few nanoseconds), the driver circuit 114 applies a signal to control terminal 222(1) to turn off power MOS device 216(1), there will be a relatively smaller Vds across the device.

It will be noted that with the half-bridge circuit implementation of FIG. 2 there is a delay between deactuation of the high-side power MOS circuit 112a and the actuation of the low-side power MOS circuit 112b in order to ensure that there is no risk for shoot-through current.

With the sequential actuation/deactuation of the power MOS devices as described, the lower voltage power MOS is always protected by the higher voltage power MOS, and as a result there is no concern with performance degradation and fluctuation during its operative lifetime. So, it is possible to then design and reach the target Rdson with the lower voltage power MOS in order to have a smaller impact in term of MOS area, driver circuit area and switching power dissipation. This benefit arises from the fact that there is no need to increase the dimensioning of the MOS devices in order to compensate for any aging degradation.

The addition of the higher voltage MOS in parallel with the lower voltage MOS will have only a small or negligible effect in terms of area and power dissipation because this added MOS is not used to achieve the target Rdson or any other performance of the circuit. Rather the additional MOS is used only during transitions to protect lower voltage MOS transistor, and so the dimensioning of the higher voltage MOS can be made smaller than the lower-voltage MOS.

The driver complexity in this architecture is a little higher due to the multi-gate driving stage and the sequencing that has to be followed. However, considering that in many applications there is already a need for more complex driving stages (e.g., for power partitioning, slew-rate control, and so on), the circuit designer can consider the addition driver complexity as negligible.

Figure 3:
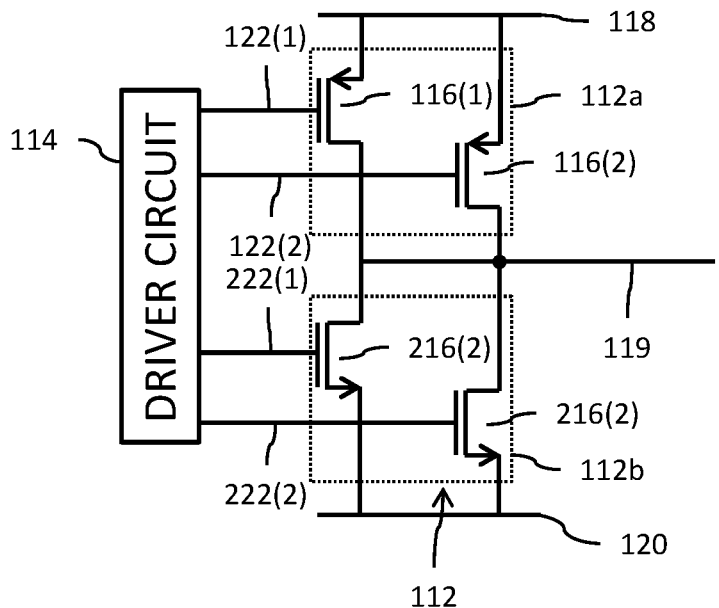
FIG. 3 is a circuit diagram of a power circuit including a half-bridge power MOS stage and a driver circuit.

FIG. 3 shows an alternative circuit implementation where the high-side power MOS circuit 112a is instead implemented using a first and second p-channel power MOS devices 116(1)-116(2) that are connected in parallel with each other between the first node 118 and the intermediate node 119. The power circuit 110 may be used in connection with a DC-DC converter application where an input voltage is applied through an inductor coupled to the intermediate node 119, an output voltage is generated at the first node 118, and a ground voltage is applied at the second node 120. The power circuit 110 may be further used in connection with a circuit application for driving an inductive load, such as a motor, where an input voltage is applied to first node 118, the inductive load (motor winding) is coupled to the intermediate node 119, and a ground voltage is applied to the second node 120.

While the invention has been illustrated and described in detail in the drawings and foregoing description, such illustration and description are considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

The invention claimed is:

1. A circuit, comprising:
a power MOS stage; and
a driver circuit configured to drive the power MOS stage;
wherein the power MOS stage comprises a first power MOS device and a second power MOS device connected in parallel between a first node and a second node, the first power MOS device having a first voltage rating characteristic and the second power MOS device having a second voltage rating characteristic that is lower than the first voltage rating characteristic; and
wherein the driver circuit is configured to drive control nodes of the first and second power MOS devices in a sequential manner when actuating the power MOS stage by actuating the first power MOS device with the first voltage rating characteristic before actuating the second power MOS device with the second voltage rating characteristic.

2. The circuit of claim 1, wherein the driver circuit is configured to drive control nodes of the first and second power MOS devices in a sequential manner when deactuating the power MOS stage by deactuating the second power MOS device with the second voltage rating characteristic before deactuating the first power MOS device with the first voltage rating characteristic.

3. The circuit of claim 1, wherein the first and second power MOS devices are n-type devices.

4. The circuit of claim 1, wherein the first and second power MOS devices are p-type devices.

5. The circuit of claim 1, wherein the power MOS stage is a switching circuit of a DC-DC converter.

6. The circuit of claim 1, wherein the power MOS stage is a switching circuit of a half-bridge driver.

7. The circuit of claim 1, wherein the power MOS stage is a switching circuit of a full-bridge driver.

8. The circuit of claim 1, wherein the first voltage rating characteristic is defined by both a maximum operating voltage (MOV) of $V_{MOV1}$ and an absolute minimum rating (AMR) of $V_{AMR1}$, and wherein the second voltage rating characteristic is defined by both a maximum operating voltage (MOV) of $V_{MOV2}$ and an absolute minimum rating (AMR) of $V_{AMR2}$, where $V_{MOV1} > V_{MOV2}$ and $V_{AMR1} > V_{AMR2}$.

9. The circuit of claim 1, wherein the first voltage rating characteristic comprises a maximum operating voltage (MOV) of $V_{MOV1}$, and wherein the second voltage rating characteristic comprises a maximum operating voltage (MOV) of $V_{MOV2}$, where $V_{MOV1} > V_{MOV2}$.

10. The circuit of claim 1, wherein the first voltage rating characteristic comprises an absolute minimum rating (AMR) of $V_{AMR1}$, and wherein the second voltage rating characteristic comprises an absolute minimum rating (AMR) of $V_{AMR2}$, where $V_{AMR1} > V_{AMR2}$.

11. A circuit including a half-bridge driver, comprising:
a high-side power MOS stage;
a low-side power MOS stage coupled in series with the high-side power MOS stage at an intermediate node; and
a driver circuit configured to drive the high-side and low-side power MOS stages;
wherein at least one of the high-side and low-side power MOS stages comprises:
a first power MOS device and a second power MOS device connected in parallel between a first node and the intermediate node, the first power MOS device having a first voltage rating characteristic and the second power MOS device having a second voltage rating characteristic that is lower than the first voltage rating characteristic; and
wherein the driver circuit is configured to drive control nodes of the first and second power MOS devices in a sequential manner when actuating the power MOS stage by actuating the first power MOS device with the first voltage rating characteristic before actuating the second power MOS device with the second voltage rating characteristic.

12. The circuit of claim 11, wherein the driver circuit is configured to drive control nodes of the first and second power MOS devices in a sequential manner when deactuating the power MOS stage by deactuating the second power MOS device with the second voltage rating characteristic before deactuating the first power MOS device with the first voltage rating characteristic.

13. The circuit of claim 11, wherein the first and second power MOS devices are n-type devices.

14. The circuit of claim 11, wherein the first and second power MOS devices are p-type devices.

15. The circuit of claim 11, wherein the first node is coupled to receive a supply voltage and the intermediate node is coupled to drive an output load.

16. The circuit of claim 11, wherein the first node is coupled to an inductor and the intermediate node is coupled to drive an output load.

17. The circuit of claim 16, wherein the inductor is coupled to a ground voltage.

18. The circuit of claim 16, wherein the inductor is coupled to receive an input voltage.

19. The circuit of claim 11, wherein the first node is coupled to an inductor and the intermediate node is coupled to a ground voltage.

20. The circuit of claim 19, wherein the inductor is coupled to receive an input voltage.

21. The circuit of claim 11, wherein the first voltage rating characteristic is defined by both a maximum operating voltage (MOV) of $V_{MOV1}$ and an absolute minimum rating (AMR) of $V_{AMR1}$, and wherein the second voltage rating characteristic is defined by both a maximum operating voltage (MOV) of $V_{MOV2}$ and an absolute minimum rating (AMR) of $V_{AMR2}$, where $V_{MOV1} > V_{MOV2}$ and $V_{AMR1} > V_{AMR2}$.

22. The circuit of claim 11, wherein the first voltage rating characteristic comprises a maximum operating voltage (MOV) of $V_{MOV1}$, and wherein the second voltage rating characteristic comprises a maximum operating voltage (MOV) of $V_{MOV2}$, where $V_{MOV1} > V_{MOV2}$.

23. The circuit of claim 11, wherein the first voltage rating characteristic comprises an absolute minimum rating (AMR) of $V_{AMR1}$, and wherein the second voltage rating characteristic comprises an absolute minimum rating (AMR) of $V_{AMR2}$, where $V_{AMR1} > V_{AMR2}$.

24. A method for driving a power MOS stage which includes a first power MOS device and a second power MOS device connected in parallel between a first node and a second node, the first power MOS device having a first voltage rating characteristic and the second power MOS device having a second voltage rating characteristic that is lower than the first voltage rating characteristic, the method comprising:

driving control nodes of the first and second power MOS devices in a sequential manner when actuating the power MOS stage by:
    actuating the first power MOS device with the first voltage rating characteristic; and
    then actuating the second power MOS device with the second voltage rating characteristic.

25. The method of claim 24, further comprising:
driving control nodes of the first and second power MOS devices in a sequential manner when deactuating the power MOS stage by:
    deactuating the second power MOS device with the second voltage rating characteristic; and
    then deactuating the first power MOS device with the first voltage rating characteristic.

26. The method of claim 24, wherein the first voltage rating characteristic is defined by both a maximum operating voltage (MOV) of $V_{MOV1}$ and an absolute minimum rating (AMR) of $V_{AMR1}$, and wherein the second voltage rating characteristic is defined by both a maximum operating voltage (MOV) of $V_{MOV2}$ and an absolute minimum rating (AMR) of $V_{AMR2}$, where $V_{MOV1} > V_{MOV2}$ and $V_{AMR1} > V_{AMR2}$.

27. The method of claim 24, wherein the first voltage rating characteristic comprises a maximum operating voltage (MOV) of $V_{MOV1}$, and wherein the second voltage rating characteristic comprises a maximum operating voltage (MOV) of $V_{MOV2}$, where $V_{MOV1} > V_{MOV2}$.

28. The method of claim 24, wherein the first voltage rating characteristic comprises an absolute minimum rating (AMR) of $V_{AMR1}$, and wherein the second voltage rating characteristic comprises an absolute minimum rating (AMR) of $V_{AMR2}$, where $V_{AMR1} > V_{AMR2}$.

* * * * *